United States Patent [19]
Crowley et al.

[11] Patent Number: 5,691,716
[45] Date of Patent: Nov. 25, 1997

[54] KEYBOARD WITH KEYS FOR MOVING CURSOR

[76] Inventors: Robert J. Crowley, 64 Puritan La., Sudbury, Mass. 01776; Donald N. Halgren, 35 Central St., Manchester, Mass. 01944

[21] Appl. No.: 564,631

[22] Filed: Nov. 29, 1995

Related U.S. Application Data

[63] Continuation-in-part of Ser. No. 447,116, Aug. 18, 1995, which is a continuation of Ser. No. 98,851, Jul. 29, 1993, Pat. No. 5,459,461.

[51] Int. Cl.$^6$ .................................................... H03K 17/94
[52] U.S. Cl. ........................................... 341/22; 345/160
[58] Field of Search ........................ 341/22, 20; 345/160, 345/157; 400/485

[56] References Cited

U.S. PATENT DOCUMENTS

| | | | |
|---|---|---|---|
| 4,680,577 | 7/1987 | Straayer et al. | 345/160 |
| 5,269,004 | 12/1993 | Comerford et al. | 341/22 X |
| 5,278,557 | 1/1994 | Stokes et al. | 341/34 |
| 5,459,461 | 10/1995 | Crowley et al. | 341/22 |

OTHER PUBLICATIONS

"Smart Key", IBM Tech. Discl. Bull., vol. 28, No. 5, pp. 1859–1860, Oct. 1985.
"Enlarged Cursor Key with Trackball", IBM Tech. Discl. Bull., vol. 33, No. 9, pp. 428–430, Feb. 1991.

*Primary Examiner*—Thomas Mullen
*Attorney, Agent, or Firm*—Don Halgren

[57] ABSTRACT

The present invention comprises a signal generator for sending an electrical signal from an expandable, flexible layer of material, the signal generator comprising an upper layer of flexible, resilient material and a lower layer of flexible, resilient material which between them define a cavity for enclosing an expandable material such as a cellular foam or gas, whereupon localized distortion of one of the layers of flexible material, effects a signal generation within the structure, which is transmissible through a proper circuit to an outside electrical device. A circuit may be arranged adjacent a plurality of said keys which senses when several of said keys are depressed in a skewed or sideways manner, so as to effect movement of a cursor or pointer on a monitor in communication with a processing unit and said keyboard.

10 Claims, 4 Drawing Sheets

KEYBOARD WITH KEYS FOR MOVING CURSOR

This application is a Continuation-In-Part Application of our co-pending U.S. patent application, Ser. No. 08/447,116 filed Aug. 18, 1995, which is a Continuation of our earlier application, Ser. No. 08/098,851, Jul. 29,1993 now U.S. Pat. No. 5,459,461, both of which are incorporated herein by reference, in their entirety.

BACKGROUND OF THE INVENTION

1. Field of the Invention

This invention relates to keyboards, and more particularly, to signal generating devices which have keys adapted for moving a cursor by themselves in addition to permitting other data input.

2. Prior Art

Miniaturization of electronic devices such as calculators, computers, telephones, amusement devices, and light electronic equipment has advanced rapidly over the past few years. Data entry devices have become miniaturized as well. The term "chicklet keys" has been used to identify very small tabs or keys utilized on some small devices for data entry into that device. While their keypads are somewhat "storable", the problem with that type of terminal is that the operator has a difficult time in hitting the proper key to efficiently do the job. The data entry operators hands/fingers are relatively large, and these keys lack tl full stroke, size and tactile contact feedback of full sized keyboards that are preferred. Current laptop and palmtop devices suffer from the problem of short stroke and compacted dense key layout. Further difficulties arise when cursor movement is desired. Touch pad screens are data entry devices which have replaced the "mouse" or trackball. Accuracy, however, may be lacking with such data entry devices, inasmuch as the exact location of a particular cursor/data entry point may be difficult to discern. One patent which has tried to show an improvement in the cursor moving art is U.S. Pat. No. 5,278,557 to Stokes et al. This patent however, discloses only a single key which is dedicated exclusively to the movement of a cursor. This is similar to a joy stick "built-into" the keyboard. This does not facilitate cursor movement while an operator's hands are on the alpha/numeric keys themselves.

It is thus an object of the present invention to provide a data entry panel which will accommodate the needs of the electronic device, will accommodate the physical reality of the data entry operator, and will permit the data entry equipment to be functionally full sized, and functionally similar feel to conventional keyboards familiar to most keyboard operators, and to permit several of the actual regular alpha/numeric keys on the keyboard to both enter data to the processing unit and to be manipulated to move a cursor/pointer themselves.

BRIEF SUMMARY OF THE INVENTION

The present invention comprises a signal generator arrangement for sending an electrical signal from an input stroke, the signal generator being defined by an upper layer of flexible, resilient, plastic-like material having an inner surface into which a fluid component is pressed thereagainst, and a signal completion means arranged within the fluid component, so as to establish an electrical signal to be sent in a proper circuit when the upper layer of flexible, resilient plastic material is deformed, or pressed by the input stroke. The fluid component adjacent the upper layer of flexible, resilient plastic material may be an expandable open or closed cellular foam material. The foam material may include a conductivity additive therewithin, which conductivity within the foam increases as the foam is compressed beyond a lower limit so as to establish a signal from that vicinity of the flexible, resilient plastic material of the upper layer.

A lower layer of flexible material may be disposed adjacent to the upper layer of flexible material, so as to define a resilient cavity or foam filled chamber therebetween. The upper layer of flexible plastic material may have a plurality of molded structures formed thereon, the molded structures enclosing at least a portion of the fluid or foam filled component thereby. An arrangement of electrodes may be arranged on or adjacent the inner side of the upper layer of flexible material, the electrodes being in electrical communication with a proper circuit through at least one of the layers of flexible material, and in communication with a further electrical device.

The cavity defined by the upper and lower layers of flexible, resilient plastic material may be filled with a gas through a valve arranged between one of the layers. The signal completion arrangement may include an arrangement of strain gauges arranged adjacent the inner surface of the upper resilient, flexible layer of material.

The invention thus comprises a signal generator for sending an electrical signal from an input stroke, comprising an upper layer of flexible, resilient plastic material having an inner surface, a fluid component pressing against the inner surface, and signal completion means arranged within the component pressing against the inner surface of the upper layer, so as to establish an electrical signal to be sent to an electrical device from the signal generator upon the receipt of a force input stroke thereon. The fluid component may in one embodiment, comprise an expandable cellular foam. The signal completion means may comprise a conductivity additive in the cellular foam. The signal generator may include a lower layer of flexible material having a periphery attached to the periphery of the upper layer, to define a fillable cavity therebetween. The upper layer has a plurality of molded structures molded therewith, the molded structures enclosing the fluid component means, and an arrangement of electrodes arranged adjacent the inner side of said upper layer, the electrodes being in electrical communication with a circuit through at least one of the layers of flexible material. A fluid controlling valve is arranged through at least one of the layers of flexible material, to permit entry of gas to the fillable cavity between the upper and lower layers of flexible material. The signal completion means in one embodiment, may comprise a strain gauge arranged adjacent the inner surface of the upper layer. The signal completion means also may comprise a plurality of layers of cellular foam, each layer having a different physical characteristic therewithin. The signal completion means may also comprise a plurality of spot electrodes arranged adjacent the inner surface of the upper layer, so as to establish a complete circuit during localized distortion of the upper layer.

The invention, in a further embodiment, comprise a signal generator for sending information to a computer monitor to effect proportional directional movement of a pointer or cursor on that monitor, comprising a plurality of the regular alpha-numeric depressable keys on the signal generator for the sending of electrical signals to the monitor through an electrical circuit, and a further electrical circuit arranged between each of said plurality of depressable keys and the signal generator, to effect motion in a cursor on the monitor, when the plurality of keys are depressed somewhat sideways or skewedly. The further electrical circuit in one embodiment, comprises a multiplicity of electrical components spaced adjacent the periphery of each of the plurality of depressable keys, each of the spaced components connected in parallel to correspondingly positioned components spaced about the other of the depressable keys, and connected to a processing unit for input to said monitor. The electrical components may comprise resistors which are variable in nature such as potentiometers, strain gages, or conductors in communication with the compressable foam (variable conductivity depending on the amount of conductors therein, and the amount of compression applied thereto), comprising part of a secondary contact point to receive signals when any of the keys are depressed or moved in a skewed or sideways direction. The signal generator may have an upper surface comprised of a layer of flexible plastic material, and the plurality of depressable keys may also formed of that flexible plastic material. A plurality of primary contact points are disposed on the lower surface of the layer of flexible material juxtaposed with respect to the secondary contact points to permit electrical communication therebetween when any of the plurality of keys are moved in a skewed manner, or pressed with an increased force to create a greater conductivity to get such cursor to move faster.

The invention further comprises a method of generating an electrical signal in order to effect proportional movement of a cursor on a computor monitor, comprising the steps of arranging a plurality of movable (depressable) keys on a keyboard so that when any of the keys (preferrably standard alpha/numeric keys) are moved, an electrical signal is sent through a first electrical circuit to a processing unit and to a monitor for display of that signal thereon, and arranging a further electrical circuit in a spaced relationship with respect to the keys, so as to send a further electrical signal to the monitor to move a cursor in a particular direction when a plurality of the keys are moved with a sideways component of motion (skewed manner). The method of generating an electrical signal includes pressing simultaneously, more than one of the plurality of depressable keys in a common skewed direction, to effect movement of the cursor or pointer on the monitor in a corresponding direction. The method of generating an electrical signal also comprises the step of increasing the force/speed of the skewed moving or increasing the number of keys simultaneously pressed in a skewed manner, to effect an increase in the speed of movement of the cursor or pointer.

The invention includes a method of generating an electrical signal from a keyboard in order to effect movement of a cursor on a monitor, comprising the steps of: moving sideways a plurality of keys arranged on the keyboard so as to send a signal from a sideways motion sensor arranged with respect to each of the plurality of keys, to the monitor, to induce cursor motion in the monitor; arranging as the sideway motion sensors, a plurality of resistors about each of the plurality of keys; connecting in parallel, corresponding resistors from each of the plurality of keys, the parallel resistors arranged as a circuit connected to the processing unit, so as to establish a circuit for sending a proportionally increasing signal to the monitor, when an increasing number of keys are moved in a corresponding sideways direction. The method includes the step of arranging as the sideways motion sensors, a plurality of strain gages between the plurality of keys and the keyboard, the strain gages connected to the monitor through a processing unit, so as to establish a circuit for sending a proportional changing signal to the monitor depending on the quantity of keys moved sideways, to effect movement of the cursor or pointer. The method also includes the steps of: fabricating the upper surface of the keyboard from a layer of flexible plastic sheet material; molding the keys into a digit depressable form as a unitary component of the flexible plastic sheet material; arranging a lower layer of material as a base of the keyboard which is sealed at a common periphery with the layer of flexible plastic material comprising the upper layer; injecting a charge of compressible foam into a cavity defined between the upper layer of flexible plastic sheet material and the lower layer of material; placing a dispersion of electrically conductive particles within the foam, so as to permit portions of the foam to be electrically conductive when the particles are compacted against one another, increasing their conductivity to establish a completed circuit therein as the foam is compressed; and arranging a plurality of contacts adjacent the periphery of the lower surface of each of the plurality of keys, the contacts being part of a circuit connected to a processing unit to effect movement in a cursor or pointer on the monitor when a key is pressed sideways. The method includes the steps of: pressing downwardly towards the base of the keyboard at least one of the plurality of keys so as to send an electrical signal to the processing unit to generate an alpha/numeric response on the monitor; and moving sideways with respect to the base of the keyboard at least two of the plurality of keys so as to send an electrical signal to the processing unit to effect a corresponding movement in a cursor or pointer on the monitor; and decompressing the foam so as to separate any compacted conductive particles, to open any circuit established therein, to await further compression and establishment of another circuit therein for transmission of a signal to the processing unit and monitor.

BRIEF DESCRIPTION OF THE DRAWING

The objects and advantages of the present invention will become more apparent when viewed in conjunction with the following drawings, in which.

DESCRIPTION OF THE PREFERRED EMBODIMENTS

Figure 1:
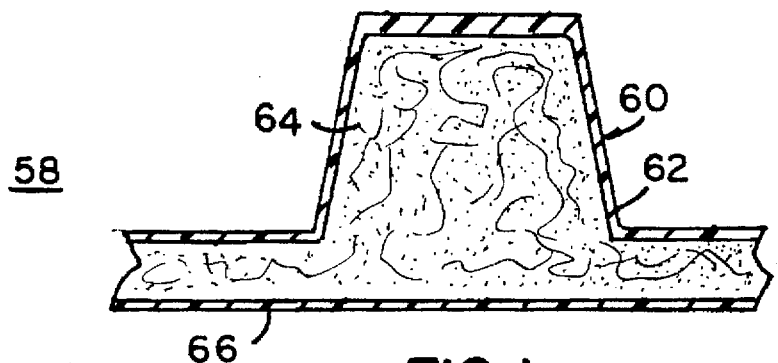
FIG. 1 is a cross-sectional view of a signal generator with a foam arranged therewithin.

The present invention relates to an expandable signal generator apparatus 58, as shown in a partial side-elevational view, in FIG. 1, wherein an expandable key 60 has a pre-molded upper layer 62 in a desired key configuration, having an enclosed volume of open or closed cell foam 64. The upper layer 62 of the key 60, being made from a thin layer of plastic material which flexes when pressed by an outside force. The foam 64 is yieldable when pressed, yet has sufficient stiffness to maintain the fullness of the key in the absence of pressure thereon. A lower layer of thin, flexible plastic material 66 of about 10-20 mil thick PVC, or the like, may be disposed across the bottom of the key 60, as shown in FIG. 1. The key may be one of a plurality of such keys on a signal generator 70, which may be, in one embodiment, arrangable on the face of a force pad 68, which pad 68 utilizes "pressure" to generate a signal therewithin, as is shown in a side-elevational view, in FIG. 2.

Figure 3:
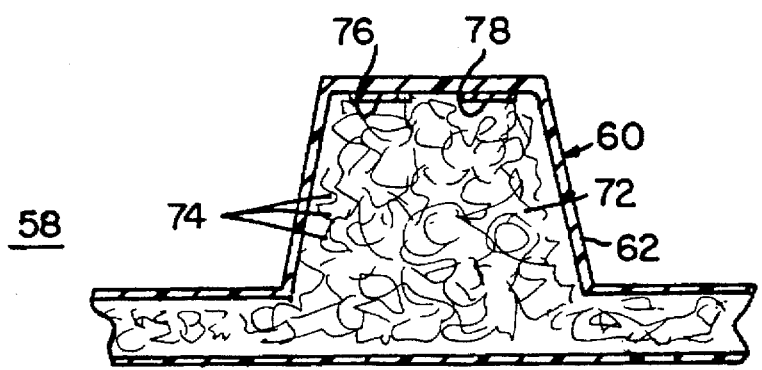
FIG. 3 is a cross-sectional view of a portion of a flexible key shown with conductive means arranged on its upper material.

The signal generator shown in FIG. 1 may have a conductive means arranged therewithin. Such conductive means may be comprised of a conductive foam material 72 as shown in FIG. 3. The foam may be conductive by virtue of a mix of metallic powder 74 in a suspension within the foam 72. A pair of electrodes 76 and 78 are shown arranged on the inner or lower side of the upper layer 62 of the flexible, plastic film. When the key 60 is distorted or compressed by an outside stroke of force, the density of the conductive components within that enclosed key 60 becomes high enough to carry a signal between the electrodes, 76 and 78. The current path between the electrodes 76 and 78, is thus complete. The electrodes 76 and 78, are part of a proper circuit, not shown, for sending the desired signal to an attached electrical device, also not shown.

Figure 4:
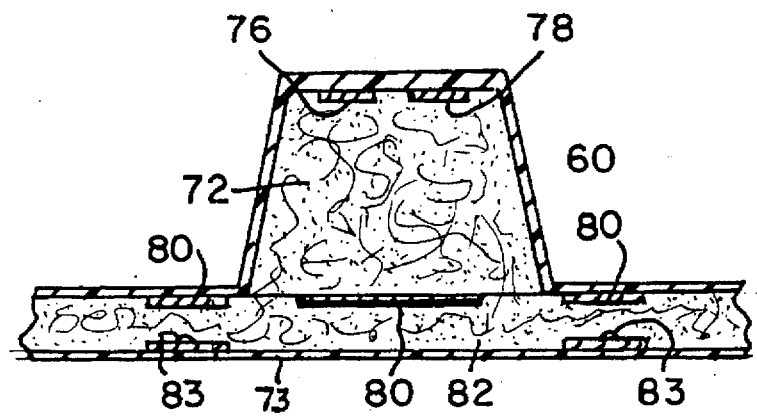
FIG. 4 is a cross-sectional view of a key of flexible keyboard, having signal establishing conductive means on the upper flexible layer and within the enclosed material as well.

Conductive strips are also shown in FIG. 4, wherein strip electrodes 80 are also arranged at a lower or base portion 82 of the conductive foam 72. Spot secondary conductive components 83, arranged within the foam 72, or on a base 73 of the generator 70, are connected to a proper response circuit, to provide directionality in the form of pointing device. Skewed pressure or distortion on one or more of the keys 60 will cause contact with, and hence signal transmission in appropriate spot electrode components such as may be disposed about the lower periphery of the appropriate keys 60, thus permitting movement of a cursor or the like, by sideways or skewed movement of the key 60, by energizing by contact, the particular secondary components 83, to which the proper circuit may be attached.

Figure 4A:
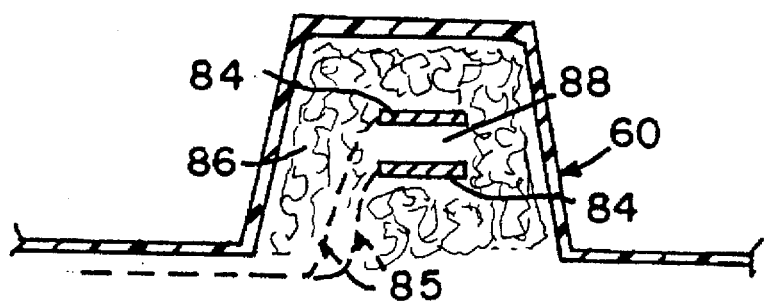
FIG. 4a is a cross-sectional view of a key for a flexible keypad, showing conductive means arranged within material disposed within the key.

In a further embodiment, thin trace metallic conductors 84 may be disposed within the foam 86, adjacent voids 88 therein, which conductors are then in contact when the key 60 is pressed or distorted by an outside force to create an electrical signal path therewithin, as shown in FIG. 4a. The conductors 84 are connected through thin wires 85, to a processor unit, not shown, to complete the data circuit. The foam 86 may, in this embodiment, also have a conductive powder dispersed therethrough, to further increase conductivity when the key 60 is compressed. Such conductivity is increased in proportion to the force applied to the movement of the key 60, because of a decrease in resistance due to the compaction and condensing of the conductive components of the foam. Similar cursor moving characteristics may be observed if the conductive components are strain gages or multiple corresponding resistors in a parallel circuit arranged on multiple keys, as described further hereinbelow.

Figure 4B:
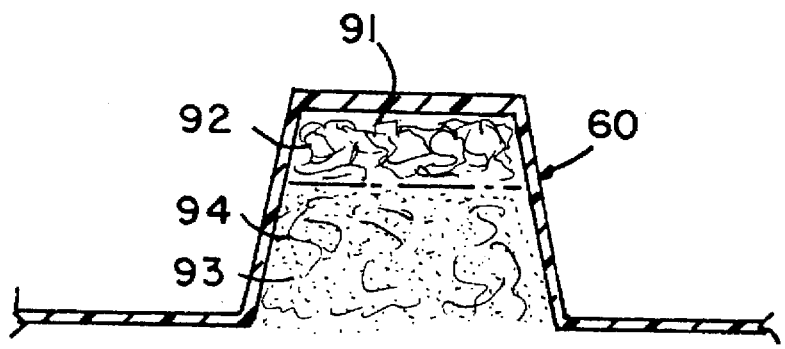
FIG. 4b is a cross-sectional view of a key on a flexible keypad having multiple density materials disposed within the molded key.

FIG. 4b shows a key 60 enclosing a foam cell material 90 having a upper foam layer 91 of high density conductive material 92 therein, and a lower layer of foam 93, of lower density conductive material 94 therein. The conductivity of the materials 92 and 94 require a higher pressure or distortion in order to effect the respective signal conducting capabilities. Such conductivity may also be effected by differing resilience/stiffness of the respective foam cells in each layer. This arrangement provides for separate signals, depending upon the amount of force/distortion applied to a key 60.

Figure 5:
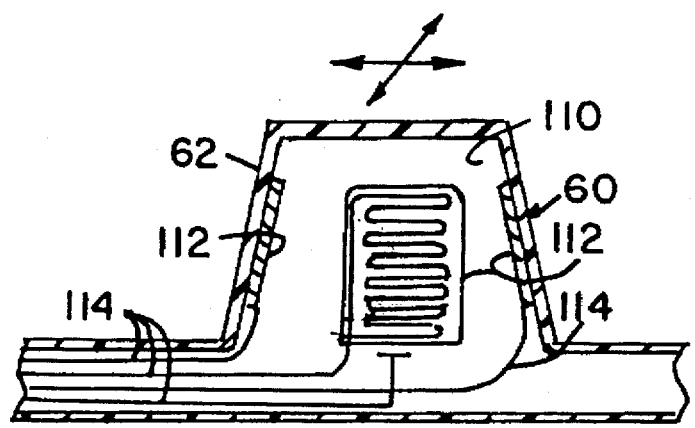
FIG. 5 is a cross-sectional view of a key on a keyboard showing a signal generating means arranged on the side walls of the molded key portion.

FIG. 5 shows a further compressible key 60 having a pressurized fluid or gas 110 therein. The upper layer 62 in this embodiment, has a plurality of strain gauges 112 spaced on its inner surface, each connected to a proper circuit 114 connected to a processor unit, not shown. These gauges 112 may be utilized with a relatively rigid key, or with a foam or gas filled key in a manner of the earlier embodiments, to indicate a direct or a skewed force against the key 60.

Figure 2A:
FIG. 2a is a flexible keyboard of the present invention shown in a rolled up configuration.
Figure 2B:
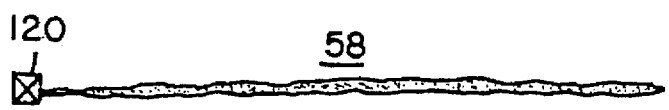
FIG. 2b is a side-elevational view of the flexible keyboard shown in FIG. 2a, in an unrolled or generally planar configuration.
Figure 2C:
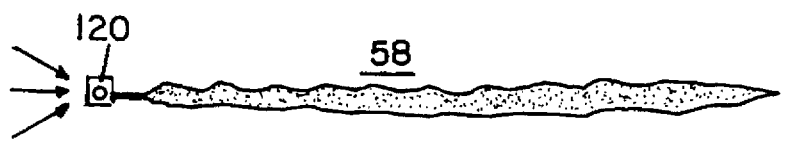
FIG. 2c is a side-elevational view of the flexible keyboard shown in FIG. 2b, in an expanding state.
Figure 2D:
FIG. 2d is a side-elevational view of the flexible keypad shown in FIG. 2c, wherein the keypad is fully expanded.
Figure 2:
FIG. 2 is a side-elevational view of a flexible keyboard assembly arranged on a force pad.

These expandable key signal generators 58 may be stored in a collapsed or rolled up configuration, as shown in FIG. 2a. The signal generator 58 may have a valve 120 (i.e. a "duckbill" valve or the like), on one end thereof. As the rolled-up signal generator 58 unfurls, the material inside, be it foam or the like, begins to expand of its own nature, as shown in FIG. 2b. The valve 120 remains open, as shown in FIG. 2c, taking in gas/air, as the flexible upper and lower layers of the signal generator 58 are pushed apart from inside, until the expansion of the signal generator 58 is complete, as shown in FIG. 2d. The valve 120 may then be closed, (or sealed of its own accord as with a duckbill valve), thus trapping the air and the foam in which it is trapped, in its expanded most configuration. Appropriate connectors, not shown, are attached to the conductive means within the signal generator 58, to direct the signals to a proper external electric component, not shown. The connective means may be comprised of wires, trace metal strips, or optical fibers.

Figure 6:
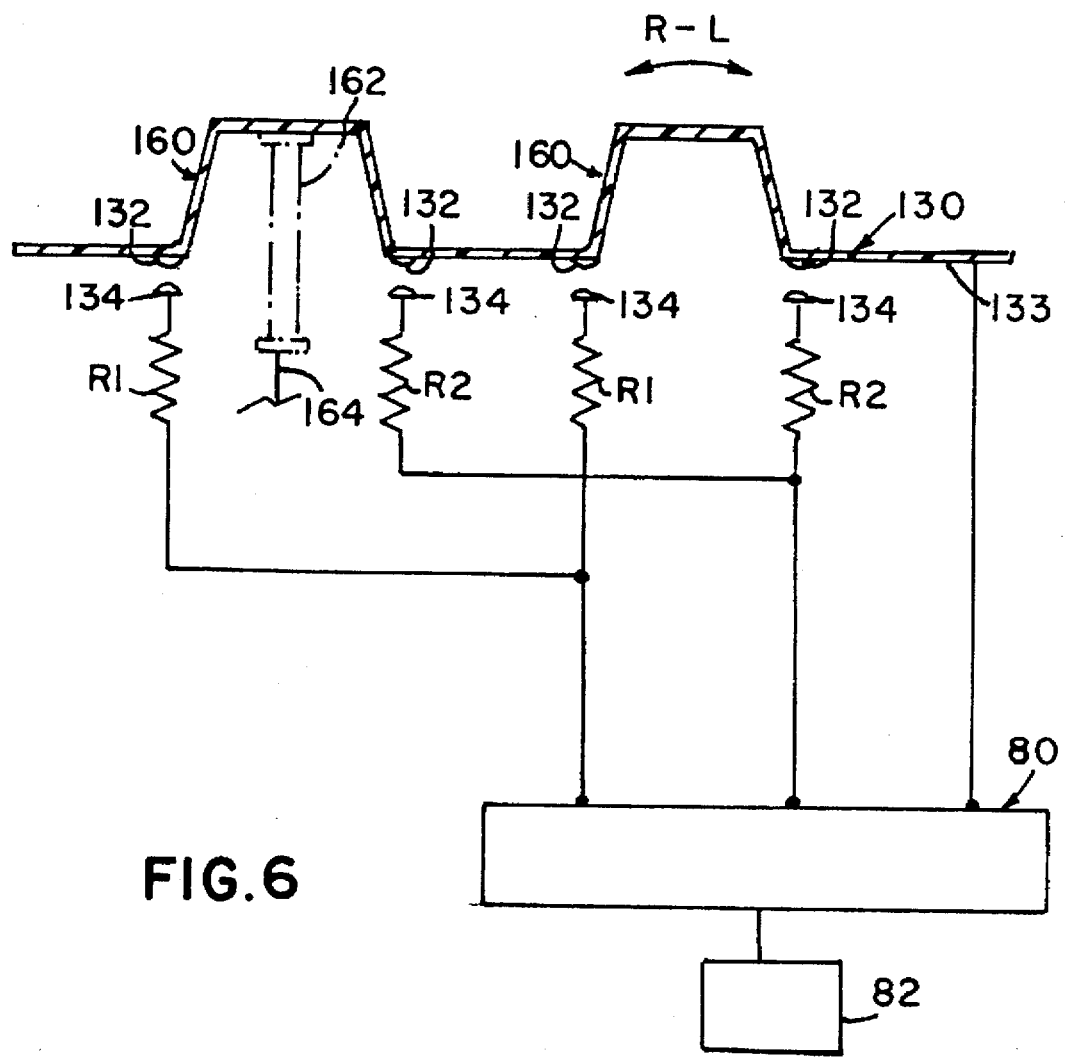
FIG. 6 is a schematic and cross-sectional representation of a portion of a keyboard showing a cursor movement arrangement of the present invention.

A further aspect of the present invention also involves the sideways (skewed) directed force or eccentric bias typically provided to a standard alpha/numeric key when a keyboard operator presses that particular key on a keyboard. If that one key were able to move the position of the cursor on a monitor, such cursor movement would be haphazard and random when that particular key was depressed. However, if all or most of the regular alpha/numeric keys on a keyboard were made directionally sensitive through a circuit arrangement associated with each key, and when more than one such key was depressed in a skewed manner, then a computer keyboard operator could effect cursor positioning by the laying of two or more of his/her fingers on the top of the "regular" keys and skewedly depressing a plurality of those keys. This effects a summation of a plurality of resistances created when a plurality of those regular keys are moved with a sideways direction/component of motion, as shown by the arrows labeled "R-L", as shown in FIG. 6. One of the exemplary additive systems embodying this concept is shown in FIG. 6, wherein a plurality of keys 160 represent a keypad 130, all of which may be formed unitarily from a layer of flexible plastic material, as aforementioned. A plurality of primary contact points 132, properly part of a common circuit 133 for each of the keys 160, are disposed about the lower peripheral edge of each key 160. Each of the primary contact points 132 are spaced slightly apart from a secondary contact point 134. Each secondary contact point 134 is connected to a resistor R1 or R2 etc, all around the periphery of the key 160. Each resistor R1 of each key 160 is further connected in parallel to every other resistor R1, as shown in FIG. 6. Each combined resistor R1+R1+R1 ... is then in electrical communication with a proper computer circuit processing unit 87, which itself is in communication with a monitor 89. A similar circuit is arranged for each other resistor R2, R3 etc. around the lower periphery of each key 160. Furthermore, in a still further embodiment, the proportionally conductive foam or strain gages may be similarly connected in a parallel arrangement with similar effect, or they may be connected to a logic device, not shown, which senses the change in resistance of the keys and converts that output to a corresponding digital signal which in turn moves the cursor on the monitor 89.

Thus a computer operator may effect cursor positioning on the monitor 89, (in addition to the standard data generated when a key 160 is pressed in the "usual" way, which may include being mounted oon a support post 162, and connected to its own circuit 164), by skewedly pressing a each of a plurality of keys 160 in a generally common direction, to effectuate simultaneous energization of corresponding components (R1 for each key 160, or R2 for each key 160 etc.) to effect cursor motion in a desired direction on the monitor 89. Multiple resistance in a parallel scheme shown in FIG. 6, provides a stronger signal when more keys 160 are skewedly pressed, thus providing the means to move a cursor faster, depending on the number of keys 60 or force on several keys, an operator may biasedly press or move simultaneously.

Thus what has been shown in a preferred embodiment, is a signal generating device which may be unfurled or expanded from a compressed configuration into a flexible functional orientation. The device may utilize compressible or distortable keys which are maintained in an erect state by an expanded fluid or foam material swelled therewithin. The device may also be able to provide pointing, or cursor movement on a monitor, merely by the skewed pressing of a plurality of keys on a keyboard, which is particularly useful on lightweight portable keyboards, where simplicity, convenience and storability are desired. Such cursor movement may also be accomplished by adapting alpha/numeric keys of a standard keyboard with the secondary circuit of the present invention so provide an indication when such keys are being given a sideways directed force. The additive secondary circuit is arranged so as to sense a tilted or sideways biased force against a plurality of keys to direct a signal to the central processing unit, to move a cursor or pointer in a connected monitor. There is no need for a "mouse", joystick, roller-ball or other contrivance to get in the way of keeping an operator's hands on the keyboard. Such an arrangement for cursor movement may also be employed in a conventional "rigid" or hard keyboard, either by placing sensors such as strain gages under the keycaps which define the conventional keys, or on the keyposts which support the keycaps on conventional keyboards, with similar effectiveness for providing electrical signals for the proportional directional movement of cursors, provided that sufficient sideways motion is permitted by the conventional key/key support mechanism.

We claim:

1. A signal generator for sending information to a computer monitor to effect proportional movement of a pointer or cursor on that monitor, comprising:

a plurality of depressable keys on said signal generator, for the sending of electrical signals to said monitor through an electrical circuit; and a further electrical circuit comprising a multiplicity of electrical components spaced adjacent the periphery of each of at least two of said depressable keys, each of said spaced components connected in parallel to correspondingly positioned spaced electrical components of the other of said at least two of said depressable keys, and to a processing unit for input to said monitor, said circuit being arranged between at least two of said depressable keys on said signal generator and said signal generator, to effect motion in a cursor on said monitor, when said at least two of said depressable keys are given a sideways direction of motion with respect to said signal generator on which said keys are disposed.

2. The signal generator as recited in claim 1, wherein said electrical components comprise resistors which are each connectable to a secondary contact point to receive signals when any of said keys are moved with a sideways direction of motion.

3. The signal generator as recited in claim 2, having an upper surface comprised of a layer of flexible plastic material, and said plurality of depressable keys are also formed of said flexible plastic material.

4. The signal generator as recited in claim 3, wherein said layer of flexible material has a lower surface thereon, and wherein a plurality of primary contact points are disposed on said lower surface of said layer of flexible material, juxtaposed with respect to said secondary contact points to permit electrical communication therebetween, when any of said plurality of depressable keys are skewedly moved.

5. The signal generator as recited in claim 3, wherein a pressurized medium selected from the group consisting of a foam or a gas, maintains a pressure against said lower surface of said flexible material to keep said signal generator inflated.

6. A method of generating an electrical signal from a keyboard in order to effect movement of a cursor or pointer on a monitor, comprising the steps of:

moving sideways with respect to said keyboard a plurality of keys arranged on said keyboard so as to send a signal from a sideways motion sensor arranged with respect to each of said plurality of keys, to said monitor, to induce cursor or pointer motion in said monitor;

arranging a plurality of resistor about each of said plurality of keys as said sideways motion sensors; and connecting in parallel, corresponding resistors from each of said plurality of keys, said parallel resistors arranged as a circuit connected to a processing unit, so as to establish a circuit for sending a proportionally increasing signal to said monitor, when an increasing number of keys are move in a corresponding sideways direction.

7. The method of generating an electrical signal from a keyboard as recited in claim 6, comprising the step of:

arranging as said sideways motion sensors, a plurality of strain gages between said plurality of keys and said keyboard, said strain gages connected to said monitor through a processing unit, so as to establish a circuit for sending a proportional changing signal to said monitor depending on the quantity of keys moved sideways, to effect movement of said cursor or pointer.

8. The method of generating an electrical signal from a keyboard as recited in claim 6, comprising the steps of:

fabricating the upper surface of said keyboard from a layer of flexible plastic sheet material;

molding said keys into a digit depressable form as a unitary component of said flexible plastic sheet material;

arranging a lower layer of material as a base of said keyboard which is sealed at a common periphery with said layer of flexible plastic material which comprises said upper layer;

injecting a charge of compressible foam into a cavity defined between said upper layer of flexible plastic sheet material and said lower layer of material;

placing a dispersion of electrically conductive particles within said foam, so as to permit portions of said foam to be electrically conductive when said particles are compacted against one another, increasing their conductivity to establish a completed circuit therein as said foam is compressed; and arranging a plurality of contacts adjacent the periphery of the lower surface of each of said plurality of keys, said contacts being part of a circuit connected to a processing unit to effect movement in a cursor or pointer on said monitor when a key is pressed sideways.

9. The method of generating an electrical signal from a keyboard as recited in claim 8, comprising the steps of:

pressing downwardly towards said base of said keyboard at least one of said plurality of keys so as to send an electrical signal to the processing unit to generate an alpha/numeric response on said monitor; and moving sideways with respect to said base of said keyboard at least two of said plurality of keys so as to send an electrical signal to the processing unit to effect a corresponding movement in a cursor or pointer on said monitor.

10. The method of generating an electrical signal from a keyboard as recited in claim 9, comprising the step of:

decompressing said foam so as to separate any compacted conductive particles to open any circuit established therein, to await further compression and establishment of another circuit therein for transmission of a signal to the processing unit and monitor.

* * * * *